United States Patent
Mishra et al.

(10) Patent No.: US 10,586,696 B2
(45) Date of Patent: Mar. 10, 2020

(54) HALOGEN ABATEMENT FOR HIGH ASPECT RATIO CHANNEL DEVICE DAMAGE LAYER REMOVAL FOR EPI GROWTH

(71) Applicant: Applied Materials, Inc., Santa Clara, CA (US)

(72) Inventors: Rohit Mishra, Santa Clara, CA (US); Yongjia Li, Sunnyvale, CA (US); Mir Abdulla Al Galib, Santa Clara, CA (US); Minoru Takahashi, Chiba (JP); Masato Ito, Chiba (JP); Jinhan Choi, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 44 days.

(21) Appl. No.: 15/976,519

(22) Filed: May 10, 2018

(65) Prior Publication Data
US 2018/0330943 A1    Nov. 15, 2018

Related U.S. Application Data

(60) Provisional application No. 62/505,550, filed on May 12, 2017.

(51) Int. Cl.
*H01L 21/02* (2006.01)
*H01L 27/11551* (2017.01)
(Continued)

(52) U.S. Cl.
CPC .. *H01L 21/02063* (2013.01); *H01L 21/02057* (2013.01); *H01L 21/02661* (2013.01);
(Continued)

(58) Field of Classification Search
CPC ......... H01L 21/02057; H01L 21/02063; H01L 21/02661; H01L 27/1151; H01L 27/11524; H01L 27/11578; H01L 27/1157
(Continued)

(56) References Cited

U.S. PATENT DOCUMENTS

| 6,379,574 B1 | 4/2002 | Ou-Yang et al. |
| 7,169,440 B2 | 1/2007 | Balasubramaniam et al. |

(Continued)

FOREIGN PATENT DOCUMENTS

EP    1143498 A2    10/2001

*Primary Examiner* — Binh X Tran
(74) *Attorney, Agent, or Firm* — Patterson + Sheridan LLP

(57) ABSTRACT

In an embodiment, a method of processing a substrate includes introducing a first process gas or a mixture of the first process gas and a second process gas into an etch chamber; exposing the substrate to the first process gas or to the mixture of the first and second process gases, the substrate having halogen residue formed on an exposed surface, the substrate having high aspect ratio features; forming and maintaining a plasma of the first process gas or a plasma of the mixture of the first and second process gases in the etch chamber to remove the residue from the surface by applying a first source power; exposing the substrate to the second process gas; and forming and maintaining a plasma of the second process gas in the etch chamber to remove the residue from the surface by applying a second source power and a bias power.

19 Claims, 2 Drawing Sheets

(51) Int. Cl.
*H01L 27/11578* (2017.01)
*H01L 27/1157* (2017.01)
*H01L 27/11524* (2017.01)

(52) U.S. Cl.
CPC .. *H01L 27/11551* (2013.01); *H01L 27/11578* (2013.01); *H01L 27/1157* (2013.01); *H01L 27/11524* (2013.01)

(58) Field of Classification Search
USPC ................................ 438/700, 714, 718, 719
See application file for complete search history.

(56) References Cited

U.S. PATENT DOCUMENTS

| | | |
|---|---|---|
| 8,034,176 B2 | 10/2011 | Tsukamoto et al. |
| 9,558,928 B2 | 1/2017 | Thedjoisworo et al. |
| 2006/0102197 A1 | 5/2006 | Chiang et al. |
| 2016/0056050 A1* | 2/2016 | Kong ................ H01L 21/31116 438/723 |
| 2016/0079077 A1* | 3/2016 | Agarwal ........... H01L 21/32136 438/714 |
| 2018/0261464 A1 | 9/2018 | Kobayashi et al. |

* cited by examiner

HALOGEN ABATEMENT FOR HIGH ASPECT RATIO CHANNEL DEVICE DAMAGE LAYER REMOVAL FOR EPI GROWTH

CROSS REFERENCE TO RELATED APPLICATIONS

This application claims benefit of U.S. Provisional Patent Application Ser. No. 62/505,550, filed May 12, 2017, the entirety of which is herein incorporated by reference.

BACKGROUND

Field

Embodiments of the present disclosure generally relate to methods of processing a substrate and semiconductor processing equipment.

Description of the Related Art

In order for silicon to grow after oxide and nitride etch processes, the damaged silicon is removed by a plasma of chlorine and bromine precursors. Following removal of the damaged silicon, halogen residues and byproducts stick to the surface and sidewalls of the substrate, outgassing over time. Over time, these halogen residues and byproducts severely corrode the wafer, chamber parts, etch parts, and downstream tools. As such, conventional halogen abatement techniques for low aspect ratio features are performed to avoid these problems. Conventional techniques of halogen abatement include $O_2$ based post-etch treatment (PET), $H_2$ based PET, aggressive fluorine-containing plasma conditions, and high temperature baking. These techniques are well-known in the art for low aspect ratio features.

However, when substrates having high aspect ratio features are etched, and the damaged silicon is removed by plasma containing chlorine and/or bromine precursors, the amount of halogen on the substrates can increase by several orders of magnitude compared to substrates having planar or low aspect ratio features. The outgassing is thus more severe with substrates having high aspect ratio feature applications. Moreover, conventional techniques for halogen abatement for substrates having planar or low aspect ratio features are ineffective or damaging to the etch profile of substrates with high aspect ratio features. For example, $O_2$ based plasma causes challenges in certain applications due to oxidation of the silicon surface. One such application is memory hole bottom clean applications where use of $O_2$ based PET hinders epitaxial growth after bottom damage removal due to oxidation of the silicon surface. $H_2$ based PET and high temperature baking of the substrate are not effective enough for high aspect ratio applications. Fluorine-based PET (using, for example nitrogen trifluoride ($NF_3$) or tetrafluoromethane ($CF_4$) based plasma) is another approach for Cl and Br abatement. However, there is a tradeoff between mild fluorine PET conditions (i.e., using low flow of fluorine-containing gas and low RF power) which does not impact the sidewall etch profile of the memory hole oxide and nitride layers but is ineffective in Cl and Br abatement, and aggressive fluorine PET processes which can have greater than 99% abatement but a significant impact on the memory hole sidewall etch profile.

Thus, there is a need for a method of removing halogen residues and byproducts from substrates having high aspect ratio features that does not damage the etch profile.

SUMMARY

In some embodiments, a method of processing a substrate is provided. The method includes introducing a first process gas or a mixture of the first process gas and a second process gas into an etch chamber; exposing the substrate to the first process gas or to the mixture of the first process gas and the second process gas, the substrate having halogen residue formed on an exposed surface, the substrate having high aspect ratio features; forming and maintaining a plasma of the first process gas or a plasma of the mixture of the first process gas and the second process gas in the etch chamber to remove the residue from the surface by applying a first source power; exposing the substrate to the second process gas; and forming and maintaining a plasma of the second process gas in the etch chamber to remove the residue from the surface by applying a second source power and a bias power.

In some embodiments, a method of processing a substrate is provided. The method includes introducing a flushing gas into an etch chamber, the flushing gas comprising a reactive gas, a nonreactive gas, or a mixture thereof; exposing the substrate to the flushing gas, the substrate having halogen residue formed on an exposed surface, the substrate having high aspect ratio features; introducing a first process gas or a mixture of the first process gas and a second process gas into the etch chamber; exposing the substrate to the first process gas or to the mixture of the first process gas and second process gas; forming and maintaining a plasma of the first process gas or a plasma of the mixture of the first process gas and the second process gas in the etch chamber to remove the residue from the surface by applying a first source power; exposing the substrate to the second process gas; and forming and maintaining a plasma of the second process gas in the etch chamber to remove the residue from the surface by applying a second source power and a bias power.

In some embodiments, a method of processing a substrate is provided. The method includes introducing a first process gas comprising one or more fluorine-containing gases and a second process gas comprising one or more nonreactive gases, into an etch chamber; exposing the substrate to the first process gas or to a mixture of the first process gas and a second process gas, the substrate having halogen residue formed on an exposed surface, the substrate having high aspect ratio features; forming and maintaining a plasma of the first process gas or a plasma of the mixture of the first process gas and second process gas in the etch chamber to remove the residue from the surface by applying a first source power; exposing the substrate to the second process gas; forming and maintaining a plasma of the second process gas in the etch chamber to remove the residue from the surface by applying a second source power and a bias power; and maintaining a temperature of the substrate between about 0° C. and about 200° C.

Other and further embodiments are described below.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
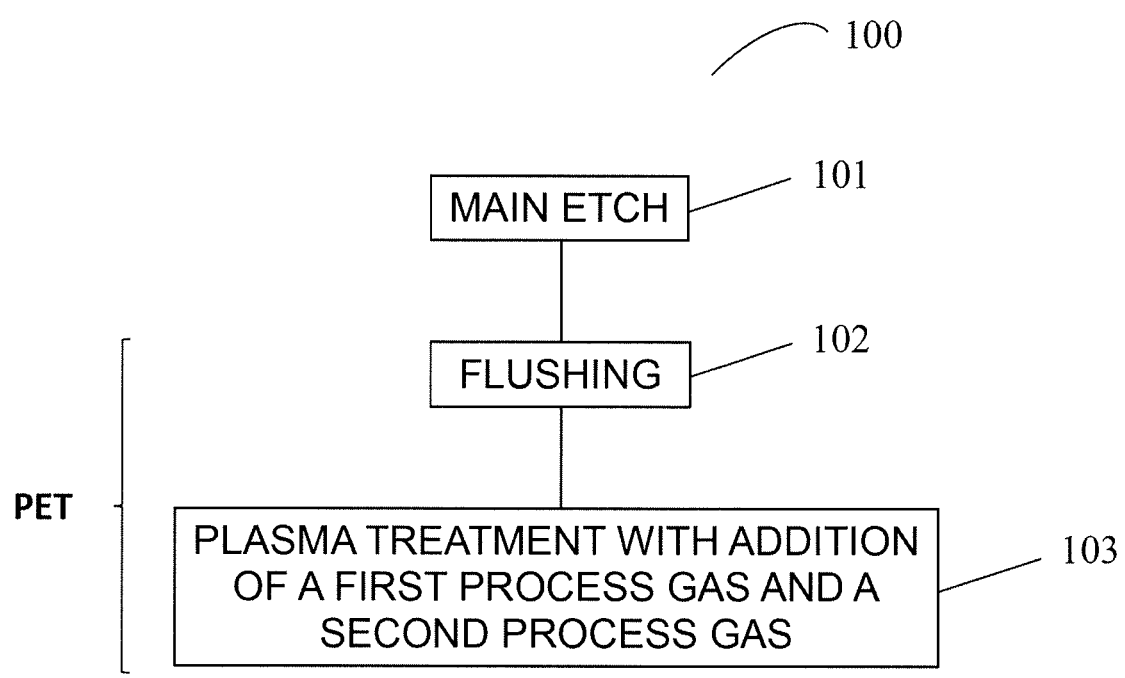
FIG. 1 is a block diagram of a post-etch treatment method including a single operation treatment or a sequence of operations according to some embodiments.

The present disclosure pertains to a mild post-etch treatment (PET) method performed for the purpose of removing residual halogen residues and byproducts remaining after the etch process without damaging the etch profile of substrates having high aspect ratio features. Through the process and chemistry of the present disclosure, the contact vias can be provided with an improved memory hole sidewall profile. Furthermore, the process chamber conditions can be easily maintained, with less undesired residues and reduced byproduct build-up both on the surface and sidewalls of the substrate and the process chamber surfaces.

The mild PET method for substrates having high aspect ratio features generally includes a combination of mild fluorine (F) based PET and a nonreactive gas based PET to be effective to remove the halogen residues and byproducts from the substrate. Individually, both mild F-based PET and the nonreactive gas-based PET are ineffective in halogen removal. However, when run in a sequential manner, or as a mixture, halogen abatement is achieved without any damage to the profile. This PET operation can be performed in the same, or a different, processing chamber as the high aspect ratio silicon etch. In general, at least one post-etch treatment operation is performed to remove residues remaining on the etched semiconductor structure surface The method can be used for any application of wafers having high aspect ratios. For example, the method can be used for memory hole bottom clean application used in 3D NAND.

In order to study the effects of halogen abatement and outgassing, ion chromatography (IC) was performed. The wafer (substrate) is transferred from the etch chamber and dipped in a bag containing a premeasured amount of deionized water. The bag containing the deionized water and the wafer is sealed and is allowed to leach for a duration of time (typically about 24 hours). The amount of halogen (Cl or Br) leached from the wafer is then measured by IC. The following measurements were performed after the damaged silicon was exposed to chlorine plasma. After etching of the high aspect ratio features, the total amount of chlorine on the wafer is about 2000 μg to 4000 μg. A large portion of the chlorine will outgas from the wafer surface. After 4 hours, >90% of the chlorine from the surface of the wafer had outgassed, and after 2 days, >95% of the chlorine from the surface of the wafer had outgassed.

The amount of chlorine detected on the wafer after PET was also determined by IC. In an exemplary process, a nonreactive gas and a reactive gas is used for PET. The nonreactive gas is Ar, and the reactive gas is nitrogen trifluoride ($NF_3$). IC was performed on a substrate undergoing three different PET operations: a nonreactive gas based PET, a reactive gas based PET, and a combination treatment of reactive gas based PET and nonreactive gas based PET. The nonreactive gas based PET (using Ar), alone, for 120 seconds was performed, and IC showed a reduction of chlorine by about 55%. The reactive gas based PET (using $NF_3$), alone, for 30 seconds was performed, and IC showed a reduction of about 70%. The combination of $NF_3$ PET for 30 seconds and Ar PET for 120 seconds was performed and proved very effective for halogen abatement, significantly reducing the amount of chlorine detected by about 98%.

In order to not damage the oxide and nitride layers of the substrate, it was found that the mild F-based PET can be performed with a low bias power or a bias power of zero.

This investigation showed that the effects of the reactive gas and nonreactive gas are synergistic, rather than merely additive. Mild F-based PET and Ar PET individually do not achieve halogen removal. However, the combination of F-based PET followed by Ar PET showed removal of >98% of halogen from the wafer surface without any adverse impact on the etch profile. It is believed that the fluorine-containing gas, after being energized in the plasma, provides free fluorine-containing radicals and ions that substitute for the chlorine and bromine residues and byproducts, or forms volatile compounds on the surface and sidewalls of the substrate, as well as removing some of the chlorine and bromine residues off of the surface. The nonreactive gas plasma (i.e., Ar ions and radicals) enhances removal of the chlorine and bromine. As discussed herein, other nonreactive gases (i.e., xenon (Xe)) and other reactive gases (i.e., sulfur hexafluoride ($SF_6$)) may be used for halogen abatement.

According to an embodiment, and following the etch process, the semiconductor structure may be exposed to a post-etch treatment operation in which the structure is contacted with a plasma generated from a first process gas comprising one or more reactive gases and a second process gas comprising one or more nonreactive gases, or combinations thereof. The reactive gas comprises at least one fluorine-containing gas, which may be $NF_3$, $SF_6$, a fluorocarbon gas, and combinations thereof. For NAND applications, the fluorine-containing gas is a carbon-free gas. The second process gas comprises at least one nonreactive gas, which may be He, Ne, Ar, Xe, among others, and combinations thereof. The synergism of the mild reactive gas (i.e., a gas comprising a fluorine-containing gas) and the nonreactive gas effectively removes residues remaining in memory hole sidewalls of the etchant species after high aspect ratio silicon etch, without damaging the oxide and nitride layers. Sidewall byproducts and residues generated during the high aspect ratio etch can be removed efficiently using the present method and the process chamber surface accumulation of such byproducts and residues can be reduced or avoided. The chamber condition can be maintained with improved stability and controllability.

Alternatively, and according to another embodiment, following the etch process, the semiconductor structure is exposed to a post-etch treatment operation in which the structure is contacted with a plasma generated from a mixture of a first process gas, comprising one or more reactive gases, and a second process gas, comprising one or more nonreactive gases. In some embodiments, this process may be repeated one or more times.

According to another embodiment, following the etch process, the semiconductor structure is exposed to a post-etch treatment operation in which the structure is contacted with a plasma generated from a first process gas, comprising one or more reactive gases, and a second process gas, comprising one or more nonreactive gases.

An exemplary configuration of a plasma reactor is a Sym3™ chamber available from Applied Materials, Inc., of Santa Clara, Calif. The high aspect ratio etch process is performed in this type of inductively coupled plasma (ICP) reactor. It is contemplated that various types of plasma reactors can be used to practice the method, such as other ICP and capacitatively coupled plasma (CCP) chambers, though the conditions for the CCP may need to be tuned. Such tuning is within the knowledge of those skilled in the art. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained by the bias power. In other applications, the bias power may not be needed and the plasma can be maintained solely by the source power. In some applications, the plasma may be generated in a different chamber from the one in which the substrate is located, and the plasma subsequently guided toward the substrate using techniques known in the art. In other applications, the plasma is generated in situ. In one embodiment, the post-etch treatment process is performed in the same plasma reactor that is used to perform the high aspect ratio etch. Alternatively, the post-etch treatment and high aspect ratio etch may be performed in separate plasma reactors.

Referring to FIG. 1 (method 100) and according to an embodiment, after performance of the main etch 101, which may be a high-aspect ratio silicon etch, a post-etch treatment method is performed on the substrate. The substrate has a plurality of high aspect ratio openings. In an embodiment, each of the openings have a height to lateral dimension of between about 10:1 to about 100:1.

The post-etch treatment method may include a single operation treatment 103 or a sequence of operations 102 and 103. Operations 102 and 103 may be performed in the same processing chamber as the high aspect ratio silicon etch process 101 or in separate plasma reactors. Method 100 may be performed by an operator or a computer program.

According to an embodiment, a method of processing a substrate comprising a single operation PET 103 can be performed. In some embodiments, operation 103 can be repeated one or more times. The method includes introducing a first process gas or gases, or a mixture of the first process gas or gases and a second process gas or gases, into an etch chamber having a substrate with halogen residue formed on an exposed surface, the substrate having high aspect ratio features; exposing the substrate to the first process gas or gases, or to the mixture of the first process gas or gases and second process gas or gases; forming and maintaining a plasma of the first process gas or gases, or a plasma of the mixture of the first process gas or gases and second process gas or gases, in the etch chamber to remove the residue from the surface by applying a first source power; exposing the substrate to the second process gas or gases; and forming and maintaining a plasma of the second process gas or gases in the etch chamber to remove the residue from the surface by applying a second source power and a bias power. Thus, in an embodiment, the method may include an operation comprising exposing the substrate to the first process gas or gases and forming and maintaining a plasma of the first process gas or gases. Alternatively, and in another embodiment, the method may include an operation comprising exposing the substrate to a mixture of the first process gas or gases and second process gas or gases, and forming and maintaining a plasma of that mixture.

The first process gas or gases comprises at least one reactive gas, the reactive gas comprising at least one fluorine-containing gas. The second process gas or gases comprises at least one nonreactive gas. By using the fluorine-containing gas and the nonreactive gas, the plasma effectively removes residues which remain in contact vias and memory hole bottom layers. Moreover, the process chamber surface accumulation of such byproducts and residues can be reduced or avoided due to reduced outgassing.

The first process gas or gases comprises at least one reactive gas. The reactive gas comprises at least one fluorine-containing gas, which may be $NF_3$, $SF_6$, a fluorocarbon gas, and combinations thereof. Examples of the fluorocarbon gas includes $CHF_3$, $CH_2F_2$, $CH_3F$, $C_3H_2F_6$, $C_2F_6$, $C_3F_6$, $O_3F_8$, $C_4F_6$, $C_4F_8$, and combinations thereof. For NAND applications, the fluorine-containing gas is a carbon-free gas. The second process gas or gases comprises at least one nonreactive gas, which may be He, Ne, Ar, Xe, or combinations thereof. The temperature of the substrate during the PET process is maintained between about 0° C. and about 200° C., such as about 50° C.

According to another embodiment, and following an etch process, a semiconductor structure may be exposed to a post-etch treatment operation in which the embodiments described herein may be repeated one or more times.

The following conditions may be used for either CCP etch reactors or ICP etch reactors. The flow rate of the reactive gas or gases is typically within the range of about 0 sccm and about 50 sccm, such as about 15 sccm, and the pressure of the reactive gas or gases is typically within the range of about 2 mTorr to about 100 mTorr, such as about 5 mTorr. The flow rate of the nonreactive gas or gases is typically within the range of about 50 sccm and about 1,000 sccm, such as about 500 sccm, and the pressure of the nonreactive gas or gases is typically within the range of about 2 mTorr to about 100 mTorr, such as about 10 mTorr.

The plasma source power for the reactive gas or gases is between about 100 W and about 2,500 W, such as about 300 W. The plasma source power for the nonreactive gas or gases is between about 150 W and about 2,500 W, such as about 1,000 W. A bias power for the reactive gas or gases within the range of about 0 W and about 50 W is typically applied. The bias power is typically maintained at a low level, or zero, to avoid affecting the oxide and nitride layers of the substrate. A bias power for the nonreactive gas or gases within the range of about 0 W and about 100 W is typically applied, such as about 50 W. The temperature of the chamber is typically between about 0° C. and about 200° C., such as about 50° C. The concentration of reactive gas or gases in the chamber is between about 30% and about 80%, for example about 70%, based on the total amount of gas in the chamber. The concentration of nonreactive gas or gases in the chamber is between about 20% and about 70%, for example about 30%, based on the total amount of gas in the chamber.

The plasma of the first process gas or gases, the second process gas or gases, or a mixture thereof, is maintained for a predetermined time period based on the substrate application or a conventional endpoint measurement technique that determines whether the halogen residues and byproducts have been sufficiently removed from the substrate surface and sidewalls. Typically, the duration for exposure to the reactive gases is controlled to be between about 15 seconds and about 180 seconds, for example about 30 seconds. The duration for exposure to the nonreactive gases is between about 15 seconds and about 120 seconds, for example about 120 seconds.

In another embodiment, a mixture of one or more reactive gases and one or more nonreactive gases is used at the same time. The flow rate of the mixture is typically within the range of about 5 sccm and about 1000 sccm, such as about 15 sccm to 100 sccm, and the pressure of the mixture is typically within the range of about 2 mTorr to about 100 mTorr, such as about 5 mTorr to about 10 mTorr. The plasma source power for the mixture is between about 100 W and about 2,000 W, for example between about 300 W and about 500 W. A bias power for the mixture is within the range of about 0 W and about 50 W is typically applied. The bias power is typically maintained at a low level, or zero, to avoid affecting the oxide and nitride layers of the substrate. The temperature of the chamber is typically between about 0° C. and about 200° C., such as about 50° C. The concentration of reactive gas or gases in the chamber is between about 30% and about 80%, such as about 70%, based on the total amount of gas in the chamber. The concentration of nonreactive gas or gases in the chamber is between about 20% and about 70%, such as about 30%, based on the total amount of gas in the chamber. The plasma of mixture is maintained for a predetermined time period based on the substrate application or a conventional endpoint measurement technique that determines whether the halogen residues and byproducts have been sufficiently removed from the substrate surface and sidewalls. Typically, the duration for exposure to the mixture is controlled to be between about 25 seconds and about 180 seconds, for example between about 30 seconds and about 90 seconds.

Alternatively, method 100 may include a post-etch treatment comprising a sequence of operations. An optional flushing operation 102 is performed after the high aspect ratio silicon etch process 101 and prior to the PET operation 103 in order to flush out halogen species remaining in the chamber after the high aspect ratio silicon etch process. The flushing operation can be performed in the same chamber as the high aspect ratio silicon etch process or in a different chamber. The flushing operation may be performed by introducing a gas or gases into the etch chamber, the gas or gases comprising a reactive gas, a nonreactive gas, or a mixture thereof, and exposing the substrate to the gas or gases. The RF power can be on or off during the flushing operation. During the flushing operation, the process chamber pressure can vary greatly with the release of halogen species. The process chamber pressure typically ranges between about 5 mTorr and about 500 mTorr. A PET operation 103 is then performed. The parameters and conditions for operation 103 are discussed above.

Throughout the mild post-etch treatment, the temperature of the substrate (for example a silicon wafer) can vary greatly under different processing recipes and applied powers. However, in order to avoid undesired reactions or damage to the oxide and nitride layers of the semiconductor structure, the substrate temperature is maintained at a temperature of about 0° C. to about 200° C., for example about 50° C., during performance of the PET.

In another embodiment, operations 102 through 103 can be, separately or as a whole, repeated one or more times.

Figure 2:
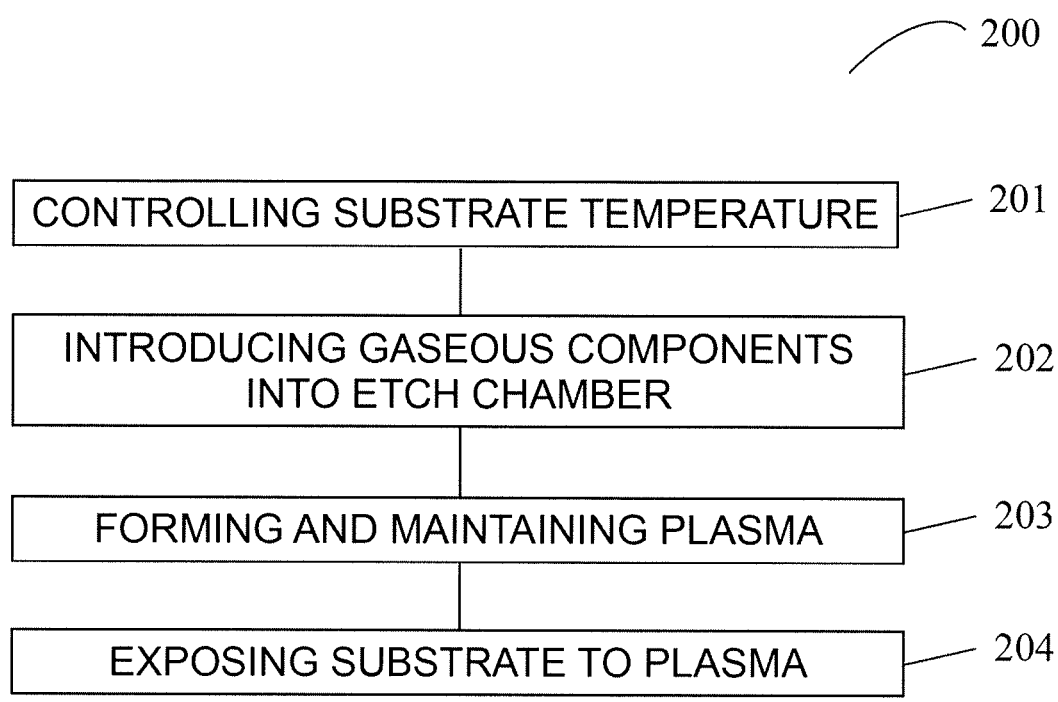
FIG. 2 is a block diagram of a method for processing a substrate by performing a post-etch treatment process in a plasma etch chamber.

FIG. 2 illustrates an embodiment of a method 200 for processing a substrate by performing a PET process in a plasma etch chamber. The substrate can be a silicon substrate with a plurality of high aspect ratio openings. The sidewalls and bottom surfaces of the high aspect ratio openings can include residual halogen residues, byproducts, and other contaminants. The method 200 includes controlling and maintaining a temperature of a substrate at operation 201. The temperature range is maintained between about 0° C. and about 200° C., such as about 50° C. At operation 202, gaseous components in the process gas or gases for residue and byproduct removal are introduced into an etch chamber of a plasma reactor. The process gas(es) may include one or more reactive gases, one or more nonreactive gases, or combinations thereof. The reactive gases can be any reactive gas described herein including fluorine-containing gases and combinations of fluorine-containing gases. The nonreactive gases can be any nonreactive gas including, for example, noble gases such as He, Ne, Ar, Xe, and combinations thereof. At operation 203, one or more power sources are turned on to allow power to be coupled into the etch chamber to form the plasma from the one or more process gases. At operations 203 and 204, the substrate is exposed to the one or more gaseous components and the plasma is maintained by one or more power sources for a duration of time to remove a sufficient amount of the residue and/or byproducts from the substrate surface. For process gases comprising fluorine-based gases, the plasma is formed and maintained by a first source power with a first bias power. The first bias power is zero or low bias power. For process gases comprising nonreactive gases, a second source power and a second bias power can be used. Accordingly, an in situ plasma of the fluorine-based gases and nonreactive gas based species may be generated between the showerhead and the substrate support.

The first source power can generate a plasma to cause the dissociation of the gases to form ions and radicals. Bias power for fluorine-based gases is maintained at zero or low power to avoid damaging the profile of the high aspect features of the substrate. A second source power and/or a second bias power can generate a plasma of the nonreactive gases. The bias power may be controlled to increase or decrease the ion bombardment with respect to the generated in situ plasma. The bias power can provide directionality to the plasma, reduce the effect of ion scattering, and direct ions to the substrate. While flowing the nonreactive gases toward the substrate, the bias power can be applied without applying a source power. Alternately, the nonreactive gases may be flowed toward the substrate while applying both a source power and a bias power. The plasmas may be generated sequentially in process 200, or may be generated concurrently. Method 200 may be performed by an operator or a computer program.

The mild PET process as described above can be performed on substrates with a plurality of high aspect ratio features to remove residues and byproducts on a substrate surface and or sidewalls after any etching process. The mild PET process avoids removing and damaging the silicon oxide and nitride layers of the substrate. In some applications, the plurality of high aspect ratio features are part of a 3D NAND structure.

According to an embodiment, a computer system programmed to perform a method of processing a substrate is provided. A controller including a central processing unit is coupled to the various components of the reactor to facilitate control of the processes of various embodiments described herein. Any computer readable medium, such as RAM, ROM, disk, or digital storage can be used. The computer readable medium contains instructions that when executed by the CPU, cause the semiconductor manufacturing apparatus to perform one or more processes of the methods described herein.

An example of an embodiment is provided to illustrate applications of some embodiments described herein. In one embodiment, the substrate may be a silicon substrate of about 200 mm (about 8 inch) or about 300 mm (about 12 inch) diameter, having a CD of about 80 nm and a depth of about 1 to about 10 μm. The substrate has a plurality of high aspect ratio openings. In an embodiment, each of the openings having a height to lateral dimension of between about 10:1 to about 100:1.

After the main etch operations are completed, the substrate is processed according to methods described herein, in which a post-etch treatment process is performed to remove halogen residues and byproducts from the surface and sidewalls of the substrate. The substrate temperature is controlled at a predetermined value. In one embodiment, the substrate temperature is controlled to be between about 40° C. to about 100° C. Alternatively, the temperature of the substrate is controlled to be between about 50° C. and about 60° C.

Gaseous components may be supplied to the process chamber through a showerhead to form a gaseous mixture therein. The flow rates of each gaseous component are controlled to be between about 0 sccm to about 1000 sccm, for example between about 50 sccm and about 500 sccm. The pressure of the gas mixture, controlled to be about 2 mTorr to about 100 mTorr, such as between about 5 mTorr and about 15 mTorr, in the process chamber may be adjusted by tuning at least one process parameter such as the volumetric flow of one or more gaseous components in the gas mixture. The gas mixture may include one or more reactive gases such as a fluorine-containing gas, for example $NF_3$, as discussed herein. Alternatively, the gas mixture comprises one or more nonreactive gases such as Argon. Alternatively, the gas mixture includes a mixture of one or more reactive gases and one or more nonreactive gases. For PET using a mixture of one or reactive gases and one or more nonreactive gases, the concentration of reactive gases can be about 0% and about 70%, based on the total amount of gas.

The plasma of the gas mixture (which may be one or more reactive gases, one or more nonreactive gases, or a mixture of one or more reactive gases and one or more nonreactive gases) is formed and maintained by turning on the RF source power. The RF source power is controlled to be about 150 W to about 2,500 W, for example between about 200 W and about 1,200 W. The RF bias power may be turned on independently to direct components of the plasma toward the substrate. The bias power is controlled to be between about 0 W and 100 W, for example, about 0 W to about 50 W. Thus, the substrate is exposed to the plasma of the gas mixture. Alternatively, the plasma of the process gas may be maintained solely by the source power. Alternatively, after the main etch operations are completed, the RF may remain on for the PET process.

The plasma is maintained for a predetermined time period based on the substrate application or an appropriate endpoint measurement technique that determines whether the halogen residues and byproducts have been sufficiently removed from the substrate surface and sidewalls. Typically, the duration of exposure to the reactive gases, at least one of which includes a fluorine-containing gas, is controlled to be between about 25 seconds and about 60 seconds, for example between about 30 seconds and about 45 seconds. Typically, the exposure duration for process gas(es) comprising one or more nonreactive gases is controlled to be between about 30 seconds and about 180 seconds, for example between about 90 seconds and about 120 seconds. As described herein, a mixture of more than one process gas may be supplied to the etch chamber. The mixture comprises one or more reactive gases and one or more nonreactive gases. Typically, the duration of time for the mixture comprising one or more reactive gases and one or more nonreactive gases is controlled to be between about 30 seconds and about 180 seconds.

The plasma of one or more process gases is stopped by turning off the RF source power and the bias power, or just the RF source power in embodiments where the bias power is not used and the flow of the gaseous components is stopped. Alternately, exposure to the plasma may be stopped by diverting plasma containing gases away from the process chamber to a bypass.

The foregoing operations may be performed simultaneously or in different order. Moreover, although not discussed in the previous example, flushing operations may be performed, as described herein. The foregoing operations may be performed by an operator or a computer system, as described above.

The plasma treatment process may be run for a period of time sufficient to remove the residues and byproducts present on substrate surface and sidewalls. It is contemplated that longer or shorter plasma treatment times may be used in applications having different aspect ratios and/or in situations where there is more, or less, residue present on the exposed substrate surfaces and sidewalls. Although not discussed in the previous example, a flushing operation may be performed as described in FIG. 1.

Using the methods described herein, byproducts formed on the sidewalls of high aspect ratio features during an etch process can be removed efficiently. The method also reduces or eliminates the problem of halogen outgassing that causes corrosion on the wafer itself, within the etch tool, or in other tools during downstream processes. In some embodiments, a method of processing a substrate may include exposing a substrate to a plasma generated from a fluorine-containing gas and a nonreactive gas. Optional operations, including a flushing operation prior to the PET, can be performed.

The descriptions of the various embodiments of the present disclosure have been presented for purposes of illustration, but are not intended to be exhaustive or limited to the embodiments disclosed. While the foregoing is directed to embodiments of the present disclosure, other and further embodiments of the disclosure may be devised without departing from the basic scope thereof, and the scope thereof is determined by the claims that follow. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of processing a substrate, comprising:
   performing an etching process on a substrate;
   performing a first post-etch treatment on the substrate, the first post-etch treatment comprising:
   introducing a first process gas or a mixture of the first process gas and a second process gas into an etch chamber;
   exposing the substrate to the first process gas or to the mixture of the first process gas and the second process gas, the substrate having halogen residue formed on an exposed surface, the substrate having a plurality of high aspect ratio openings, the plurality of high aspect ratio openings having a height to lateral dimension of between about 10:1 to about 100:1;

forming and maintaining a plasma of the first process gas or a plasma of the mixture of the first process gas and the second process gas in the etch chamber to remove the halogen residue from the surface by applying a first source power; and performing a second post-etch treatment on the substrate, the second post-etch treatment comprising:
exposing the substrate to the second process gas; and
forming and maintaining a plasma of the second process gas in the etch chamber to remove the halogen residue from the surface by applying a second source power and a bias power, wherein the etching process is different from the first post-etch treatment and the second post-etch treatment, and wherein the second post-etch treatment occurs after the first post-etch treatment.

2. The method of claim 1, further comprising maintaining a temperature of the substrate between 0° C. and 200° C. during the first post-etch treatment and during the second post-etch treatment.

3. The method of claim 1, wherein the plasma of the first process gas is maintained for 15 seconds to 120 seconds, and the plasma of the second process gas is maintained for about 15 seconds to about 120 seconds.

4. The method of claim 1, further comprising:
introducing a flushing gas into the etch chamber, the flushing gas comprising a reactive gas, a nonreactive gas, or a mixture thereof;
and exposing the substrate to the flushing gas.

5. The method of claim 1, wherein the first source power is between about 150 Watts and about 2500 Watts.

6. The method of claim 1, wherein the bias power is between about 0 Watts and about 100 Watts.

7. The method of claim 1, wherein the first process gas comprises at least one reactive gas, the reactive gas comprising at least one fluorine-containing gas.

8. The method of claim 7, wherein the at least one fluorine-containing gas comprises $NF_3$, $SF_6$, fluorocarbons, or combinations thereof.

9. The method of claim 1, wherein the second process gas comprises at least one nonreactive gas.

10. The method of claim 9, wherein the at least one nonreactive gas comprises Ar, Xe, He, Ne, or combinations thereof.

11. A method processing a substrate, comprising:
performing an etching process on a substrate;
introducing a flushing gas into an etch chamber, the flushing gas comprising a reactive gas, a nonreactive gas, or a mixture thereof;
exposing the substrate to the flushing gas, the substrate having halogen residue formed on an exposed surface, the substrate having a plurality of high aspect ratio openings, the plurality of high aspect ratio openings having a height to lateral dimension of between about 10:1 to about 100:1;
performing a first post-etch treatment on the substrate, the first post-etch treatment comprising:
introducing a first process gas or a mixture of the first process gas and a second process gas into the etch chamber, the first process gas comprising at least one reactive gas, the reactive gas comprising $NF_3$, $SF_6$, a fluorocarbon, or a combination thereof, the second process gas comprising at least one nonreactive pas;
exposing the substrate to the first process gas or to the mixture of the first process gas and second process gas;
forming and maintaining a plasma of the first process gas or a plasma of the mixture of the first process gas and the second process gas in the etch chamber to remove the halogen residue from the surface by applying a first source power; and
performing a second post-etch treatment on the substrate, the second post-etch treatment comprising
exposing the substrate to the second process gas; and
forming and maintaining a plasma of the second process gas in the etch chamber to remove the halogen residue from the surface by applying a second source power and a bias power, wherein the etching process is different from the first post-etch treatment and the second post-etch treatment, and wherein the second post-etch treatment occurs after the first post-etch treatment.

12. The method of claim 11, wherein the at least one nonreactive gas comprises Ar, Xe, He, Ne, or combinations thereof.

13. The method of claim 11, further comprising maintaining a temperature of the substrate between about 0° C. and about 200° C. during the first post-etch treatment and during the second post-etch treatment.

14. The method of claim 11, wherein the plasma of the first process gas is maintained for 15 seconds to 120 seconds, and the plasma of the second process gas is maintained for 15 seconds to 120 seconds.

15. The method of claim 11, wherein the first source power is between about 150 Watts and about 2500 Watts.

16. A method processing a substrate, comprising:
performing an etching process on a substrate; and
performing a first post-etch treatment on the substrate, the first post-etch treatment comprising:
introducing a first process gas and a second process gas into an etch chamber, the first process gas comprising at least one reactive gas, the reactive gas comprising $NF_3$, $SF_6$, a fluorocarbon, or a combination thereof, the second process gas comprising at least one nonreactive gas;
exposing the substrate to the first process gas or to a mixture of the first process gas and a second process gas, the substrate having halogen residue formed on an exposed surface, the substrate having a plurality of high aspect ratio openings, the plurality of high aspect ratio openings having a height to lateral dimension of between about 10:1 to about 100:1;
forming and maintaining a plasma of the first process gas or a plasma of the mixture of the first process gas and second process gas in the etch chamber to remove the halogen residue from the surface by applying a first source power; and
performing a second post-etch treatment on the substrate, the second post-etch treatment comprising:
exposing the substrate to the second process gas; and
wherein the etching process is different from the first post-etch treatment and the second post etch treatment, and wherein the second post-etch treatment occurs after the first post-etch treatment.

17. The method of claim 16, wherein the second process gas comprises Ar, Xe, or a combination thereof.

18. The method of claim 17, wherein the first process gas is maintained for 15 seconds to 120 seconds, and the plasma of the second process gas is maintained for about 15 seconds to 120 seconds.

19. The method of claim 16, wherein:
the first source power is between about 150 Watts and about 2500 Watts;

the second source power is between about 150 Watts and about 2500 Watts; and the bias power is between about 0 Watts and about 100 Watts.

* * * * *

UNITED STATES PATENT AND TRADEMARK OFFICE
CERTIFICATE OF CORRECTION

PATENT NO. : 10,586,696 B2
APPLICATION NO. : 15/976519
DATED : March 10, 2020
INVENTOR(S) : Rohit Mishra et al.

Page 1 of 1

It is certified that error appears in the above-identified patent and that said Letters Patent is hereby corrected as shown below:

In the Specification

In Column 3, Line 42, after "surface" insert -- . --.

In Column 5, Line 10, delete "capacitatively" and insert -- capacitively --, therefor.

In Column 8, Line 52, delete "and or" and insert -- and/or --, therefor.

In the Claims

In Column 11, Line 64, in Claim 11, delete "pas;" and insert -- gas; --, therefor.

In Column 12, Line 54, in Claim 16, after "and" insert -- forming and maintaining a plasma of the second process gas in the etch chamber to remove the halogen residue from the surface by applying a second source power and a bias power, --.

In Column 12, Line 56, in Claim 16, delete "post etch" and insert -- post-etch --, therefor.

Signed and Sealed this
Twenty-sixth Day of May, 2020

Andrei Iancu
*Director of the United States Patent and Trademark Office*